US012047043B2

United States Patent
Kobori et al.

(10) Patent No.: US 12,047,043 B2
(45) Date of Patent: Jul. 23, 2024

(54) POWER AMPLIFIER DEVICE

(71) Applicant: Murata Manufacturing Co., Ltd., Kyoto (JP)

(72) Inventors: Tsutomu Kobori, Kyoto (JP); Shingo Yanagihara, Kyoto (JP); Yoshifumi Takahashi, Kyoto (JP); Hiroshi Okabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 613 days.

(21) Appl. No.: 17/242,815

(22) Filed: Apr. 28, 2021

(65) Prior Publication Data
US 2021/0344312 A1 Nov. 4, 2021

(30) Foreign Application Priority Data

Apr. 30, 2020 (JP) ................ 2020-080793

(51) Int. Cl.
*H03F 3/02* (2006.01)
*H01L 23/31* (2006.01)
(Continued)

(52) U.S. Cl.
CPC ......... *H03F 3/245* (2013.01); *H01L 23/3128* (2013.01); *H03F 3/195* (2013.01); *H03F 2200/451* (2013.01)

(58) Field of Classification Search
CPC .... H03F 3/245; H03F 3/195; H03F 2200/451; H03F 2203/30084; H03F 2203/30117; H03F 3/3066; H01L 23/3128; H01L 23/3677; H01L 24/05; H01L 24/11; H01L 24/14; H01L 29/401; H01L 29/41708; H01L 2223/6644; H01L 2224/0401; H01L 2224/05568; H01L 2224/1134; H01L 2224/11462; H01L 2224/131; H01L 2224/13144; H01L 2224/13147;
(Continued)

(56) References Cited

U.S. PATENT DOCUMENTS 10,629,591 B2 * 4/2020 Koya ................ H01L 23/5226
2020/0091874 A1 * 3/2020 Sasaki .................... H03F 3/195

FOREIGN PATENT DOCUMENTS

JP     2004-235290 A     8/2004

* cited by examiner

*Primary Examiner* — Andrea Lindgren Baltzell
*Assistant Examiner* — Jose E Pinero
(74) *Attorney, Agent, or Firm* — Pearne & Gordon LLP (57) ABSTRACT

A power amplifier device includes a semiconductor substrate; a plurality of first transistors that are provided on the semiconductor substrate and receive input of a radio-frequency signal; a plurality of second transistors that are provided on the semiconductor substrate and electrically connected to the respective plurality of first transistors, and output a radio-frequency output signal obtained by amplifying the radio-frequency signal; a plurality of first bumps provided so as to overlay the respective plurality of first transistors; and a second bump provided away from the plurality of first bumps and provided so as not to overlay the plurality of first transistors and the plurality of second transistors. When viewed in plan from a direction perpendicular to a surface of the semiconductor substrate, a first transistor and a first bump, a second transistor, the second bump, a second transistor, and a first transistor and a first bump are arranged in sequence.

9 Claims, 10 Drawing Sheets

(51) Int. Cl.
*H03F 3/195* (2006.01)
*H03F 3/24* (2006.01)

(58) Field of Classification Search
CPC ... H01L 2224/14151; H01L 2924/1421; H01L 23/66; H01L 24/13
USPC .......................................................... 330/295
See application file for complete search history.

POWER AMPLIFIER DEVICE

CROSS REFERENCE TO RELATED APPLICATION

This application claims priority from Japanese Patent Application No. 2020-080793 filed on Apr. 30, 2020. The content of this application is incorporated herein by reference in its entirety.

BACKGROUND OF THE DISCLOSURE

Field of the Disclosure

The present disclosure relates to a power amplifier device.

Description of the Related Art

Japanese Unexamined Patent Application Publication No. 2004-235290 discloses a device with a distributed amplifier mounted thereto, and the device with the distributed amplifier mounted thereto is obtained by flip-chip mounting the distributed amplifier composed of a semiconductor chip to a mounting substrate. In the device with the distributed amplifier mounted thereto disclosed in Japanese Unexamined Patent Application Publication No. 2004-235290, a bump (a protruding connection conductor in Japanese Unexamined Patent Application Publication No. 2004-235290) is provided between transistor cells constituting the distributed amplifier. The distributed amplifier is connected to a ground conductor layer on a mounting substrate side through the bump. Furthermore, for distributed amplifiers, there is a configuration in which a common bump is provided for a plurality of transistor cells.

In Japanese Unexamined Patent Application Publication No. 2004-235290, since the bump is provided between transistor cells, there is a possibility that the heat generated in a transistor may not be able to be efficiently dissipated to the outside. Furthermore, in a configuration where the bump is provided so as to overlay a plurality of transistor cells, there is a possibility that feedback capacitance of a transistor may increase to result in a reduction in characteristics.

BRIEF SUMMARY OF THE DISCLOSURE

The present disclosure provides a power amplifier device that achieves excellent heat dissipation and also enables an improvement in characteristics.

A power amplifier device according to one aspect of the present disclosure includes a semiconductor substrate; a plurality of first transistors provided on the semiconductor substrate and configured to receive input of a radio-frequency signal; a plurality of second transistors provided on the semiconductor substrate, electrically connected to the respective plurality of first transistors, and configured to output a radio-frequency output signal obtained by amplifying the radio-frequency signal; a plurality of first bumps provided so as to overlay the respective plurality of first transistors; and a second bump provided away from the plurality of first bumps and provided so as not to overlay the plurality of first transistors and the plurality of second transistors. When viewed in plan from a direction perpendicular to a surface of the semiconductor substrate, a first transistor and a first bump, a second transistor, the second bump, a second transistor, and a first transistor and a first bump are arranged in sequence.

The power amplifier device according to one aspect of the present disclosure achieves excellent heat dissipation and also enables an improvement in characteristics.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

An embodiment of the present disclosure will be described in detail below with reference to the drawings. Note that the present disclosure is not to be limited by this embodiment. Each embodiment is illustrative, and it goes without saying that configurations described in different embodiments can be partially replaced or combined. In second and subsequent embodiments, a description of things in common with a first embodiment is omitted, and only respects in which the second and subsequent embodiments differ from the first embodiment will be described. In particular, similar function effects achieved by similar configurations are not described one by one in each embodiment.

Embodiments

Figure 1:
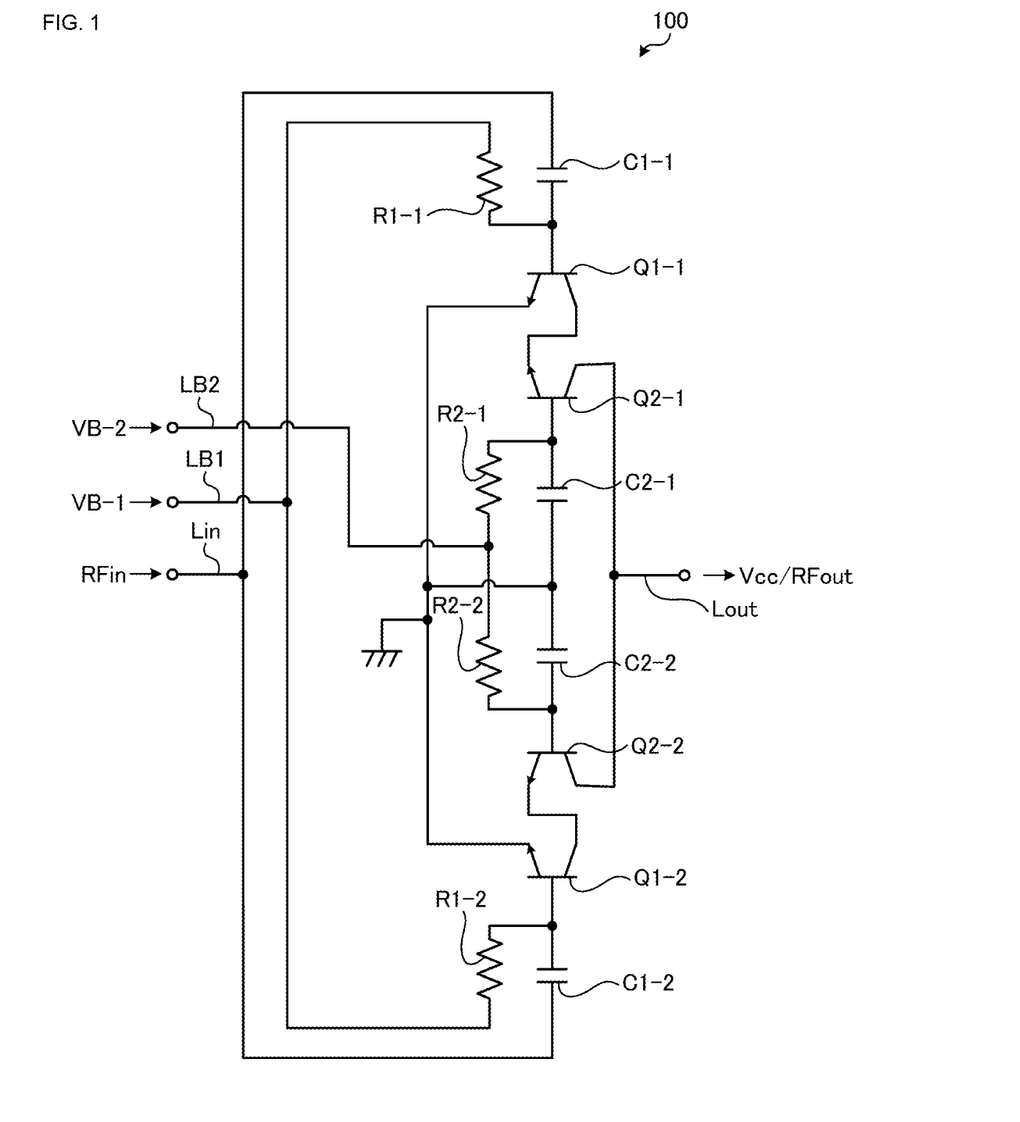
FIG. 1 is a circuit diagram of a power amplifier device according to an embodiment.

FIG. 1 is a circuit diagram of a power amplifier device according to an embodiment. For example, in a mobile communication device, such as a cellular phone device, a power amplifier device 100 amplifies a radio-frequency input signal RFin with a radio frequency and outputs a radio-frequency output signal RFout. The frequencies of the radio-frequency input signal RFin and the radio-frequency output signal RFout range, for example, from about several hundred megahertz (MHz) to about several tens of gigahertz (GHz). Note that the frequencies of the radio-frequency input signal RFin and the radio-frequency output signal RFout are merely an example and are not limited to this.

As illustrated in FIG. 1, the power amplifier device 100 includes a plurality of first transistors Q1-1 and Q1-2, a plurality of second transistors Q2-1 and Q2-2, a plurality of first resistors R1-1 and R1-2, a plurality of first capacitors C1-1 and C1-2, a plurality of second resistors R2-1 and R2-2, and a plurality of second capacitors C2-1 and C2-2.

A circuit constituted by the first transistor Q1-1, the second transistor Q2-1, the first resistor R1-1, the first capacitor C1-1, the second resistor R2-1, and the second capacitor C2-1 is symmetrical to a circuit constituted by the first transistor Q1-2, the second transistor Q2-2, the first resistor R1-2, the first capacitor C1-2, the second resistor R2-2, and the second capacitor C2-2.

A radio-frequency input signal RFin is supplied to bases of the plurality of first transistors Q1-1 and Q1-2 through a common input signal line Lin. Radio-frequency output signals RFout are output from collectors of the plurality of second transistors Q2-1 and Q2-2 through a common output signal line Lout. Furthermore, a first bias signal VB-1 is supplied to the plurality of first resistors R1-1 and R1-2 through a common first bias line LB1. A second bias signal VB-2 is supplied to the plurality of second resistors R2-1 and R2-2 through a common second bias line LB2.

In the following description, an upper circuit in FIG. 1 (the circuit constituted by the first transistor Q1-1, the second transistor Q2-1, the first resistor R1-1, the first capacitor C1-1, the second resistor R2-1, and the second capacitor C2-1) will be described. The description of the upper circuit in FIG. 1 is also applicable to a lower circuit in FIG. 1 (the circuit constituted by the first transistor Q1-2, the second transistor Q2-2, the first resistor R1-2, the first capacitor C1-2, the second resistor R2-2, and the second capacitor C2-2).

In the present embodiment, the plurality of first transistors Q1-1 and Q1-2 and the plurality of second transistors Q2-1 and Q2-2 are bipolar transistors. As an example of a bipolar transistor, a heterojunction bipolar transistor (HBT) is given. Note that the present disclosure is not limited to this. Each transistor may be, for example, a field effect transistor (FET). In this case, a base, a collector, and an emitter are respectively replaced with a gate, a drain, and a source. The transistor may be a multi-finger transistor including a plurality of unit transistors (also referred to as fingers) electrically connected in parallel. A unit transistor refers to a minimum component constituting the transistor.

The first transistor Q1-1 is a common-emitter amplifier circuit. The first transistor Q1-1 amplifies a radio-frequency input signal RFin and outputs an amplified radio-frequency signal to the second transistor Q2-1. The second transistor Q2-1 is a common-base amplifier circuit. The second transistor Q2-1 amplifies the radio-frequency signal supplied from the first transistor Q1-1 and outputs an amplified radio-frequency output signal RFout.

Specifically, an emitter of the first transistor Q1-1 is electrically connected to a reference potential. The base of the first transistor Q1-1 is electrically connected to the input signal line Lin through the first capacitor C1-1. The radio-frequency input signal RFin is input to the base of the first transistor Q1-1 through the input signal line Lin and the first capacitor C1-1.

Furthermore, the base of the first transistor Q1-1 is electrically connected to one end of the first resistor R1-1. The other end of the first resistor R1-1 is electrically connected to the first bias line LB1. A first bias signal VB-1 is input from the first bias line LB1 to the other end of the first resistor R1-1.

A collector of the first transistor Q1-1 is electrically connected to an emitter of the second transistor Q2-1. The radio-frequency input signal RFin amplified by the first transistor Q1-1 is supplied to the emitter of the second transistor Q2-1.

A base of the second transistor Q2-1 is electrically connected to one end of the second capacitor C2-1. The other end of the second capacitor C2-1 is electrically connected to the reference potential.

Furthermore, the base of the second transistor Q2-1 is electrically connected to one end of the second resistor R2-1. The other end of the second resistor R2-1 is electrically connected to the second bias line LB2. A second bias signal VB-2 is input from the second bias line LB2 to the other end of the second resistor R2-1.

The collector of the second transistor Q2-1 is electrically connected to the output signal line Lout. A power-supply potential Vcc is supplied to the collector of the second transistor Q2-1 through the output signal line Lout. Thus, the second transistor Q2-1 amplifies the radio-frequency input signal RFin and outputs the amplified radio-frequency output signal RFout to the output signal line Lout.

The power amplifier device 100 has a cascode configuration in which the first transistor Q1-1 and the second transistor Q2-1 are connected. Furthermore, in the power amplifier device 100, the circuit in which the first transistor Q1-1 and the second transistor Q2-1 are connected and the circuit in which the first transistor Q1-2 and the second transistor Q2-2 are connected are provided so as to be symmetrical to each other. Thus, in comparison with a power amplifier having a single configuration, the power amplifier device 100 can increase a current value of a radio-frequency output signal RFout. Consequently, in comparison with the power amplifier having a single configuration, the power amplifier device 100 can increase output power.

FIG. 1 is a schematic diagram provided to facilitate understanding of the present disclosure, and a configuration of the power amplifier device 100 can be appropriately changed. For example, when necessary, the power amplifier device 100 may include an element, such as an inductor. Alternatively, circuits, such as a bias circuit and a matching network, may be provided.

Figure 2:
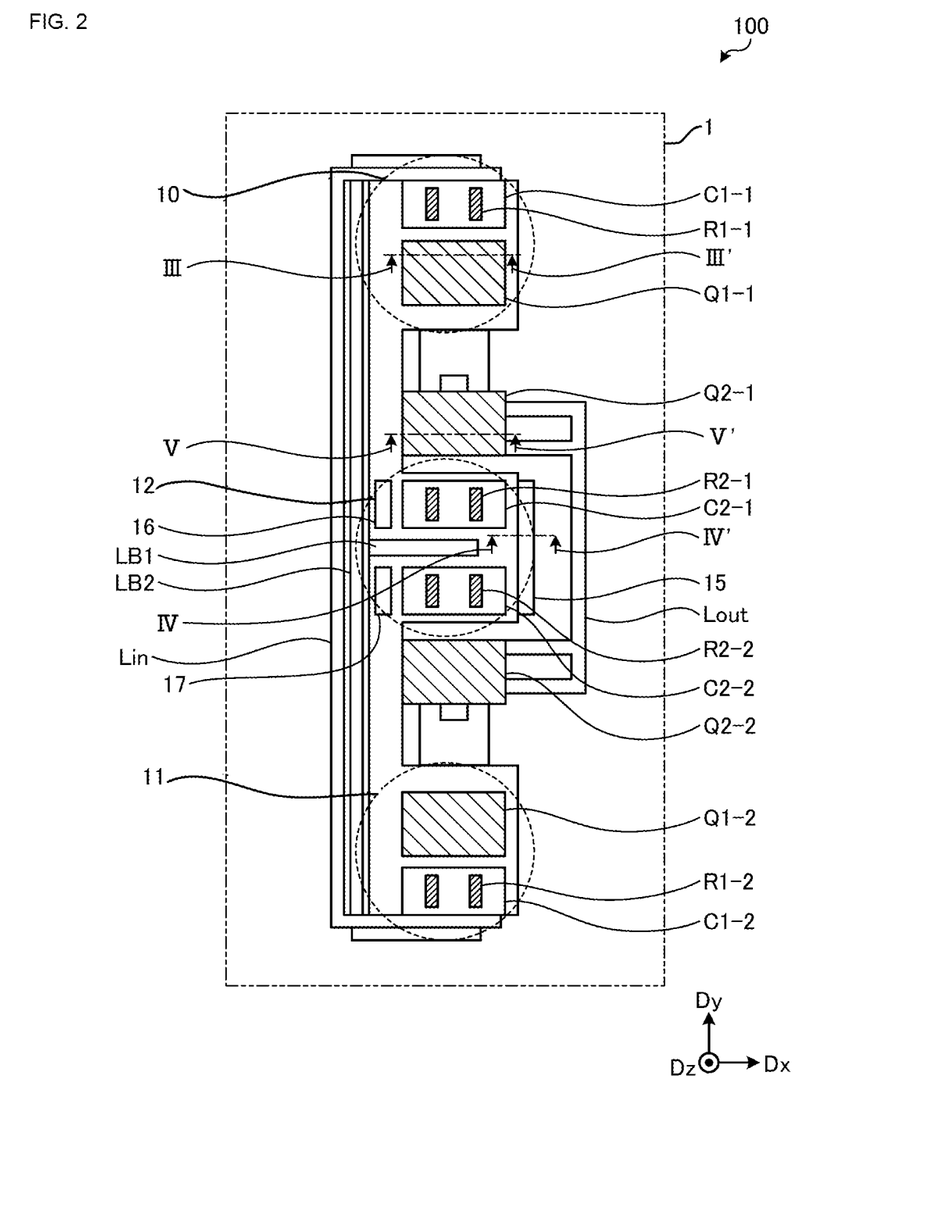
FIG. 2 is a plan view illustrating the power amplifier device according to the embodiment.

FIG. 2 is a plan view illustrating the power amplifier device according to the embodiment. As illustrated in FIG. 2, the power amplifier device 100 further includes a semiconductor substrate 1, a plurality of first bumps 10 and 11, and a second bump 12. In FIG. 2, the semiconductor substrate 1 is indicated by the dash-dot-dot line, and the plurality of first bumps 10 and 11 and the second bump 12 are indicated by the dotted line.

In the following description, a first direction Dx and a second direction Dy are directions parallel to a surface of the semiconductor substrate 1, and the second direction Dy is orthogonal to the first direction Dx. A third direction Dz is orthogonal to the first direction Dx and the second direction Dy. The third direction Dz is a normal direction to the surface of the semiconductor substrate 1. Furthermore, in the present disclosure, "elements when viewed in plan" refers to a layout relationship between elements as viewed from the third direction Dz.

The plurality of first transistors Q1-1 and Q1-2, the plurality of second transistors Q2-1 and Q2-2, the plurality of first resistors R1-1 and R1-2, the plurality of first capacitors C1-1 and C1-2, the plurality of second resistors R2-1 and R2-2, and the plurality of second capacitors C2-1 and C2-2 are provided on or above the semiconductor substrate 1. The plurality of first transistors Q1-1 and Q1-2, the plurality of second transistors Q2-1 and Q2-2, the plurality of first resistors R1-1 and R1-2, the plurality of first capacitors C1-1 and C1-2, the plurality of second resistors R2-1 and R2-2, and the plurality of second capacitors C2-1 and C2-2 are arranged along the second direction Dy.

Specifically, with respect to the plurality of first transistors Q1-1 and Q1-2 and the plurality of second transistors Q2-1 and Q2-2, the first transistor Q1-1 and the second transistor Q2-1 and the first transistor Q1-2 and the second transistor Q2-2 are disposed such that the first transistor Q1-1 and the second transistor Q2-1 are symmetrical to the first transistor Q1-2 and the second transistor Q2-2 with respect to, as an axis of symmetry, a virtual line passing through a midpoint in the second direction Dy of the semiconductor substrate 1 and extending along the first direction Dx.

In comparison with the second transistors Q2-1 and Q2-2, the first transistors Q1-1 and Q1-2 are located on a perimeter side of the semiconductor substrate 1. In other words, in the second direction Dy, the first transistor Q1-2, the second transistor Q2-2, the second transistor Q2-1, and the first transistor Q1-1 are arranged in sequence.

Similarly, with respect to each resistor and each capacitor, the first resistor R1-1, the first capacitor C1-1, the second resistor R2-1, and the second capacitor C2-1 are disposed so as to be symmetrical to the first resistor R1-2, the first capacitor C1-2, the second resistor R2-2, and the second capacitor C2-2 with respect to the line.

The first resistor R1-1 and the first capacitor C1-1 are provided adjacent to the first transistor Q1-1 in the second direction Dy. The first resistor R1-2 and the first capacitor C1-2 are provided adjacent to the first transistor Q1-2 in the second direction Dy. In the second direction Dy, in comparison with the first transistors Q1-1 and Q1-2, the first resistors R1-1 and R1-2 and the first capacitors C1-1 and C1-2 are located on the perimeter side of the semiconductor substrate 1. In other words, in the second direction Dy, the first transistors Q1-1 and Q1-2 and the second transistors Q2-1 and Q2-2 are provided between the first resistor R1-1 and first capacitor C1-1 and the first resistor R1-2 and first capacitor C1-2.

The second resistor R2-1 and the second capacitor C2-1 are provided adjacent to the second transistor Q2-1 in the second direction Dy. The second resistor R2-2 and the second capacitor C2-2 are provided adjacent to the second transistor Q2-2 in the second direction Dy. In the second direction Dy, in comparison with the second transistors Q2-1 and Q2-2, the second resistors R2-1 and R2-2 and the second capacitors C2-1 and C2-2 are located on a center side of the semiconductor substrate 1. In other words, the second resistors R2-1 and R2-2 and the second capacitors C2-1 and C2-2 are provided between the second transistors Q2-1 and Q2-2 adjacent to each other in the second direction Dy.

When viewed in plan, the first resistors R1-1 and R1-2 are provided so as to overlay the respective first capacitors C1-1 and C1-2. Furthermore, when viewed in plan, the second resistors R2-1 and R2-2 are provided so as to overlay the respective second capacitors C2-1 and C2-2. Note that the present disclosure is not limited to this. When viewed in plan, the first resistors R1-1 and R1-2 may be disposed adjacent to the respective first capacitors C1-1 and C1-2 without overlaying the respective first capacitors C1-1 and C1-2. When viewed in plan, the second resistors R2-1 and R2-2 may be disposed adjacent to the respective second capacitors C2-1 and C2-2 without overlaying the respective second capacitors C2-1 and C2-2. Each capacitor may be formed by a plurality of wiring layers 51, 52, 53, and 54 provided above the semiconductor substrate 1 or may be formed by a chip component. Each resistor may also be formed by a chip component.

The input signal line Lin and the second bias line LB2 extend in the second direction Dy and are disposed adjacent to the plurality of first transistors Q1-1 and Q1-2 and the plurality of second transistors Q2-1 and Q2-2 in the first direction Dx (on the left side of FIG. 2). The output signal line Lout is disposed adjacent to the plurality of second transistors Q2-1 and Q2-2 in the first direction Dx (on the right side of FIG. 2). At least part of the first bias line LB1 extends in the first direction Dx and is provided between the second resistor R2-1 and second capacitor C2-1 and the second resistor R2-2 and second capacitor C2-2.

Various lines, such as the input signal line Lin and the second bias line LB2, are provided by using different layers of the semiconductor substrate 1. In other words, in a portion where lines intersect with or are in contact with each other when viewed in plan in FIG. 2, the lines are insulated from each other by an insulating film provided between layers.

The plurality of first bumps 10 and 11 and the second bump 12 are, for example, copper (Cu) pillar bumps and are formed by using an electrolytic plating technique. Note that the plurality of first bumps 10 and 11 and the second bump 12 may be, for example, solder bumps, stud bumps, or gold bumps. For the plurality of first bumps 10 and 11 and the second bump 12, a material having excellent conductivity and a low thermal resistance value is used.

The first bump 10 is provided so as to overlay the first transistor Q1-1, the first resistor R1-1, and the first capacitor C1-1. The first bump 11 is provided so as to overlay the first transistor Q1-2, the first resistor R1-2, and the first capacitor C1-2.

The second bump 12 is provided away from the first bumps 10 and 11 and is provided between the first bump 10 and the first bump 11 in the second direction Dy. The second bump 12 is provided so as not to overlay the first transistors Q1-1 and Q1-2 and the second transistors Q2-1 and Q2-2. When viewed in plan, the second bump 12 is provided between the second transistor Q2-1 and the second transistor Q2-2 adjacent to each other in the second direction Dy. Furthermore, the second bump 12 overlays the second resistors R2-1 and R2-2, the second capacitors C2-1 and C2-2, and at least part of the first bias line LB1.

Furthermore, in a region overlaid with the second bump 12, connection portions 15, 16, and 17 connected to the semiconductor substrate 1 are formed. The connection portions 15, 16, and 17 are formed by through vias and form heat-transfer paths between the semiconductor substrate 1 and the second bump 12. When viewed in plan, the plurality of second capacitors C2-1 and C2-2 and the plurality of second resistors R2-1 and R2-2 are disposed between the connection portion 15 and the connection portions 16 and 17 adjacent to the connection portion 15 in the first direction Dx.

As described above, when the power amplifier device 100 is viewed in plan from a direction perpendicular to the surface of the semiconductor substrate 1, in the second direction Dy, the first transistor Q1-2 and the first bump 11, the second transistor Q2-2, the second bump 12, the second transistor Q2-1, and the first transistor Q1-1 and the first bump 10 are arranged in sequence. More specifically, the first transistor Q1-2 and the first bump 11, the second transistor Q2-2, the second bump 12, the second transistor Q2-1, and the first transistor Q1-1 and the first bump 10 are disposed on a straight line.

The first bump 10 is provided so as to overlay the first resistor R1-1 and the first capacitor C1-1. The first bump 11 is provided so as to overlay the first resistor R1-2 and the first capacitor C1-2. Note that the present disclosure is not limited to this. The first bump 10 only has to be provided so as to overlay at least one of the first resistor R1-1 and the first capacitor C1-1. The first bump 11 only has to be provided so as to overlay at least one of the first resistor R1-2 and the first capacitor C1-2. Alternatively, the first bumps 10 and 11 only have to overlay at least the respective first transistors Q1-1 and Q1-2 and do not have to overlay the first resistors R1-1 and R1-2 and the first capacitors C1-1 and C1-2. Furthermore, the second bump 12 only has to be provided so as to overlay at least one of the second resistor R2-1, the second resistor R2-2, the second capacitor C2-1, and the second capacitor C2-2.

Figure 3:
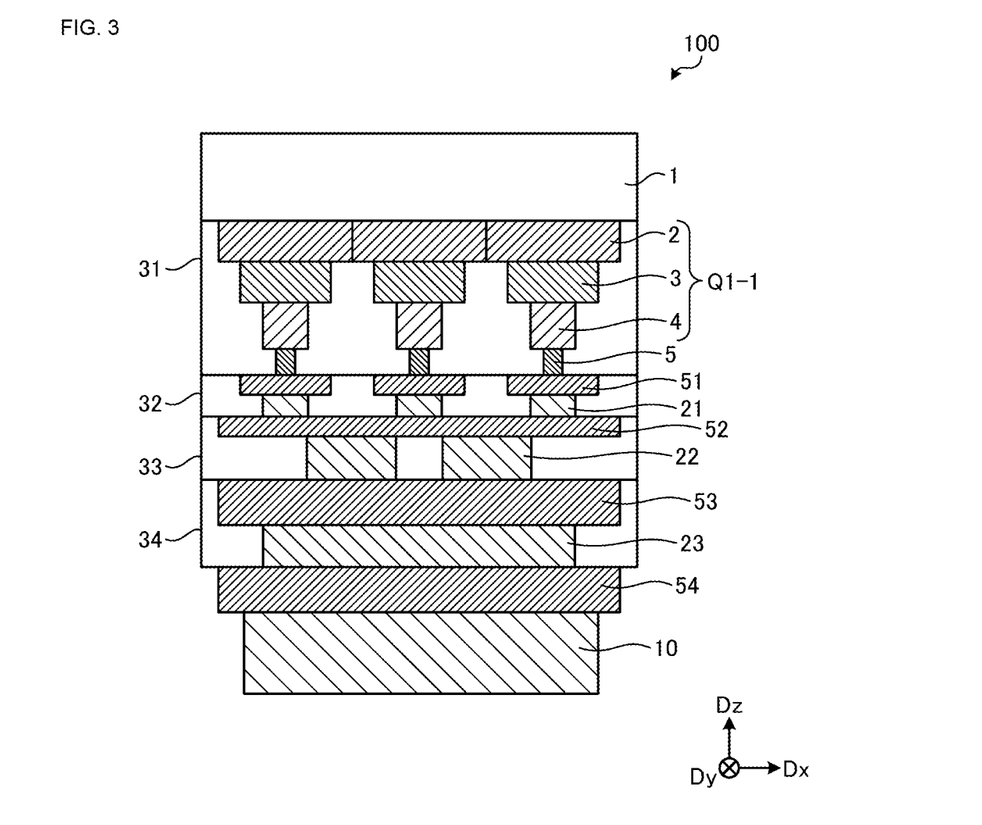
FIG. 3 is a cross-sectional view taken along III-III' in FIG. 2.

Next, a cross-sectional structure of the power amplifier device 100 will be described. FIG. 3 is a cross-sectional view taken along III-III' in FIG. 2. FIG. 3 illustrates a cross-sectional structure of the first transistor Q1-1 and the first bump 10. The description of FIG. 3 is also applicable to a cross-sectional structure of the first transistor Q1-2 and the first bump 11.

As illustrated in FIG. 3, on the surface of the semiconductor substrate 1, a collector layer 2, a base layer 3, and an emitter layer 4 are stacked in sequence. An insulating film 31 is provided so as to cover the collector layer 2, the base layer 3, and the emitter layer 4. A plurality of wiring layers 51 are provided on the insulating film 31. Each of the plurality of wiring layers 51 is connected to the emitter layer 4 through an emitter electrode 5 provided so as to extend through the insulating film 31. In FIG. 3, although the first transistor Q1-1 is constituted by three bipolar transistors, the number of bipolar transistors is not limited to three and may be one or may be three or more.

A plurality of insulating films 32, 33, and 34 are stacked so as to cover the plurality of wiring layers 51. The wiring layer 52 is provided between the insulating films 32 and 33. The wiring layer 53 is provided between the insulating films 33 and 34. A plurality of wiring layers 54 are provided on a surface of the insulating film 34. Furthermore, the wiring layers 51, 52, 53, and 54 are electrically connected by vias 21, 22, and 23 provided between the wiring layers 51, 52, 53, and 54.

The first bump 10 overlays the first transistor Q1-1 and is connected to the wiring layers 54. For the wiring layers 51, 52, 53, and 54 and the vias 21, 22, and 23, a conductive material having more excellent conductivity and a lower thermal resistance value than the insulating films 31, 32, 33, and 34 is used. Thus, the first bump 10 is electrically connected to the emitter layer 4 of the first transistor Q1-1. Furthermore, the wiring layers 51, 52, 53, and 54 and the vias 21, 22, and 23 form heat-transfer paths between the first transistor Q1-1 and the first bump 10. Thus, the heat generated in the first transistor Q1-1 is successfully transferred to the first bump 10 through a heat-transfer path and is efficiently dissipated from the first bump 10 to the outside.

Figure 4:
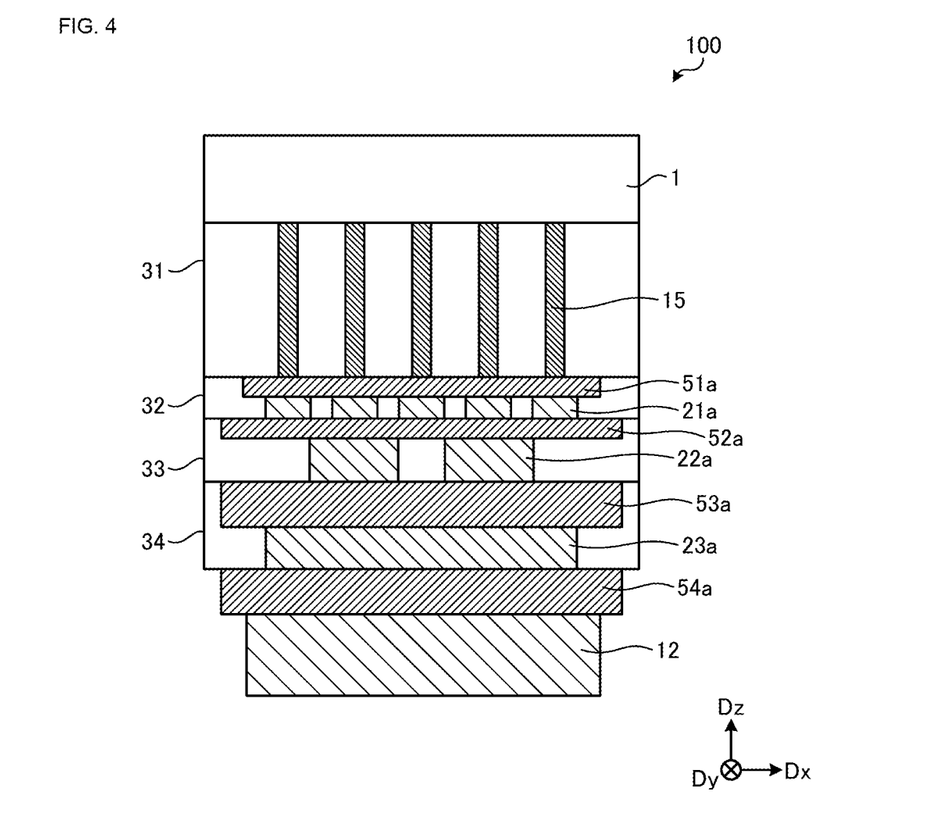
FIG. 4 is a cross-sectional view taken along IV-IV' in FIG. 2.

FIG. 4 is a cross-sectional view taken along IV-IV' in FIG. 2. FIG. 4 illustrates a cross-sectional structure of the second bump 12 and connection portions 15 in a region near, of the power amplifier device 100 illustrated in FIG. 2, a central portion in the second direction Dy. In other words, FIG. 4 illustrates a cross-sectional structure in a region where the first transistors Q1-1 and Q1-2 and the second transistors Q2-1 and Q2-2 are not provided.

As illustrated in FIG. 4, on the semiconductor substrate 1, a plurality of insulating films 31, 32, 33, and 34 and wiring layers 51a, 52a, 53a, and 54a are stacked. A plurality of wiring layers 51a, 52a, and 53a are respectively provided between the insulating films 31 and 32, between the insulating films 32 and 33, and between the insulating films 33 and 34. A plurality of wiring layers 54a are provided on a surface layer of the insulating film 34. Furthermore, the wiring layers 51a, 52a, 53a, and 54a are electrically connected by vias 21a, 22a, and 23a provided between the wiring layers 51a, 52a, 53a, and 54a. The wiring layers 51a, 52a, 53a, and 54a are provided in the same respective layers as the wiring layers 51, 52, 53, and 54 illustrated in FIG. 3 are provided.

Furthermore, in the insulating film 31, a plurality of connection portions 15 connected to the semiconductor substrate 1 are provided. The plurality of connection portions 15 extend through the insulating film 31, the upper ends thereof are connected to the semiconductor substrate 1, and the lower ends are connected to the wiring layer 51a. For the plurality of connection portions 15 as well as the vias 21a, 22a, and 23a, a conductive material having excellent conductivity and a low thermal resistance value is used.

The second bump 12 is connected to the wiring layers 54a at a place where the second bump 12 overlays the connection portions 15. The connection portions 15, the wiring layers 51a, 52a, 53a, and 54a, and the vias 21a, 22a, and 23a form heat-transfer paths between the semiconductor substrate 1 and the second bump 12. Thus, in the region where the first transistors Q1-1 and Q1-2 and the second transistors Q2-1 and Q2-2 are not provided, thermal resistance of the semiconductor substrate 1 can be reduced. As a result, even if the first bumps 10 and 11 and the second bump 12 are provided so as not to overlay the second transistors Q2-1 and Q2-2, the heat generated in the second transistors Q2-1 and Q2-2 is successfully transferred to the second bump 12 from the semiconductor substrate 1 through the heat-transfer paths including the connection portions 15 and is efficiently dissipated from the second bump 12 to the outside.

In FIG. 4, although the connection portions 16 and 17 are not illustrated, the connection portions 16 and 17 as well as the connection portions 15 are provided so as to extend through the insulating film 31, and the upper ends thereof are connected to the semiconductor substrate 1.

Figure 5:
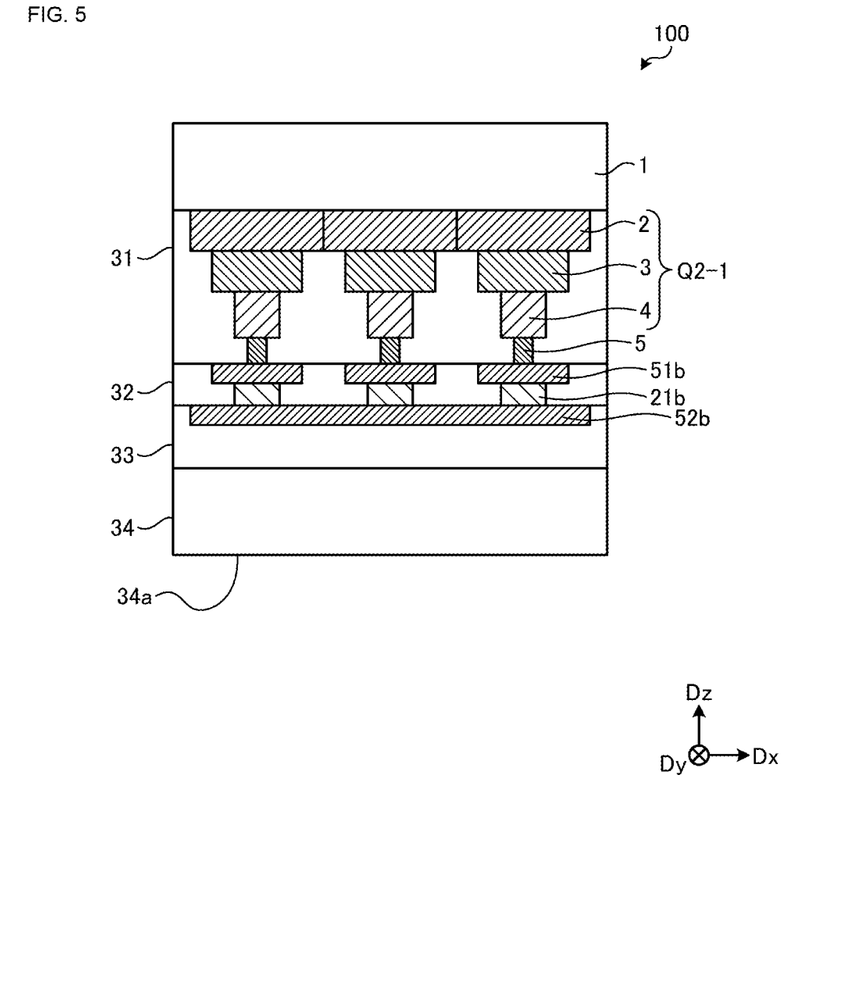
FIG. 5 is a cross-sectional view taken along V-V' in FIG. 2.

FIG. 5 is a cross-sectional view taken along V-V' in FIG. 2. FIG. 5 illustrates a cross-sectional structure of the second transistor Q2-1. As illustrated in FIG. 5, on the surface of the semiconductor substrate 1, the collector layer 2, the base layer 3, and the emitter layer 4 are stacked in sequence. The second transistor Q2-1 has a cross-sectional structure similar to that of the above-described first transistor Q1-1.

The insulating film 31 is provided so as to cover the collector layer 2, the base layer 3, and the emitter layer 4. On the insulating film 31, a plurality of wiring layers 51b are provided. Each of the plurality of wiring layers 51b is connected to the emitter layer 4 through the emitter electrode 5 provided so as to extend through the insulating film 31.

The plurality of insulating films 32, 33, and 34 are stacked so as to cover the plurality of wiring layers 51b. A wiring layer 52b is provided between the insulating films 32 and 33. Furthermore, the wiring layers 51b and 52b are electrically connected by vias 21b provided therebetween. In a region overlaid with the second transistor Q2-1, no wiring layer is provided between the insulating films 33 and 34, and no wiring layer and bump are also provided on a surface 34a of the insulating film 34.

Thus, for example, in comparison with the case where one substantially elliptical bump is provided so as to overlay the plurality of first transistors Q1-1 and Q1-2 and the plurality of second transistors Q2-1 and Q2-2, the number of electrical conductors that overlay the second transistor Q2-1 can be reduced. Consequently, the feedback capacitance of the second transistor Q2-1 is reduced to keep the characteristics from being deteriorated.

The emitter layer 4 of the second transistor Q2-1 illustrated in FIG. 5 is electrically connected to the collector of the first transistor Q1-1 through the wiring layers 51b and 52b. Note that the second transistor Q2-1 and the first transistor Q1-1 may be connected in any manner. The second transistor Q2-1 and the first transistor Q1-1 may be connected through a plurality of wiring layers or may be connected by using a line (not illustrated) of the surface 34a.

The cross-sectional views illustrated in FIGS. 3 to 5 are merely schematic views and can be changed as appropriate. For example, the number of stacked layers of the insulating films 31, 32, 33, and 34, a thickness of each insulating film, the number of stacked layers of the wiring layers 51, 52, 53, and 54, and a thickness of each wiring layer can be changed as appropriate when necessary. Furthermore, the connection portions 15 illustrated in FIG. 4 only have to be provided so as to extend through at least one insulating film 31. The connection portions 15 may be provided so as to extend through two or more insulating films.

Figure 6:
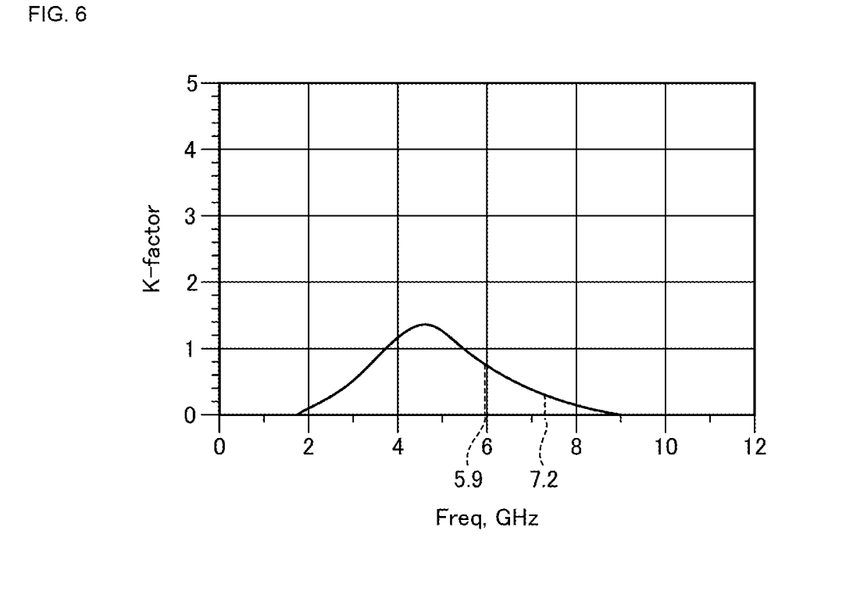
FIG. 6 is a graph illustrating K-factor frequency characteristics of the power amplifier device according to the embodiment.
Figure 7:
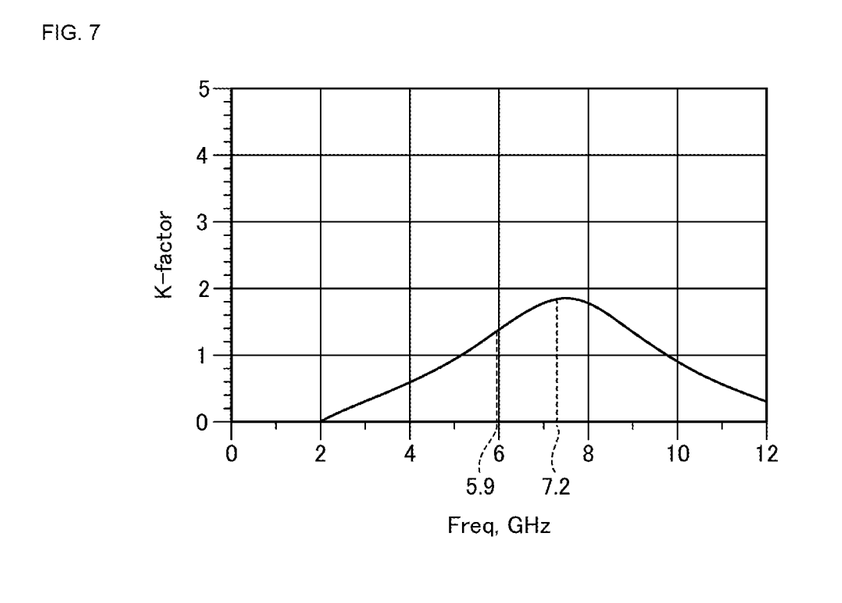
FIG. 7 is a graph illustrating K-factor frequency characteristics of a power amplifier device according to a comparative example.

FIG. 6 is a graph illustrating K-factor frequency characteristics of the power amplifier device according to the embodiment. FIG. 7 is a graph illustrating K-factor frequency characteristics of a power amplifier device according to a comparative example. In the power amplifier device according to the comparative example illustrated in FIG. 7, the plurality of first transistors Q1-1 and Q1-2 and the plurality of second transistors Q2-1 and Q2-2 are overlaid with one bump. In other words, a substantially elliptical bump elongated in the second direction Dy is formed so as to cover the plurality of first transistors Q1-1 and Q1-2 and the plurality of second transistors Q2-1 and Q2-2. The power amplifier device according to the comparative example is similar to that in the embodiment in terms of a layout relationship between and circuit configurations of the plurality of first transistors Q1-1 and Q1-2, the plurality of second transistors Q2-1 and Q2-2, and so forth.

As illustrated in FIGS. 6 and 7, a K-factor of the power amplifier device 100 according to the embodiment is higher than that in the comparative example, and high circuit stability is exhibited. More specifically, as indicated by graph 1 of FIG. 6, the power amplifier device 100 according to the embodiment provides K=about 1.36 at a frequency of 5.9 GHz and K=about 1.86 at a frequency of 7.2 GHz. On the other hand, as indicated by graph 2 of FIG. 7, the power amplifier device according to the comparative example provides K=about 0.78 at a frequency of 5.9 GHz and K=about 0.33 at a frequency of 7.2 GHz.

From this result, it is indicated that, when the first bumps 10 and 11 and the second bump 12 are provided so as not to overlay the plurality of second transistors Q2-1 and Q2-2, the feedback capacitance of the second transistors Q2-1 and Q2-2 is reduced to thereby enable an improvement in circuit stability of the power amplifier device 100.

Figure 8:
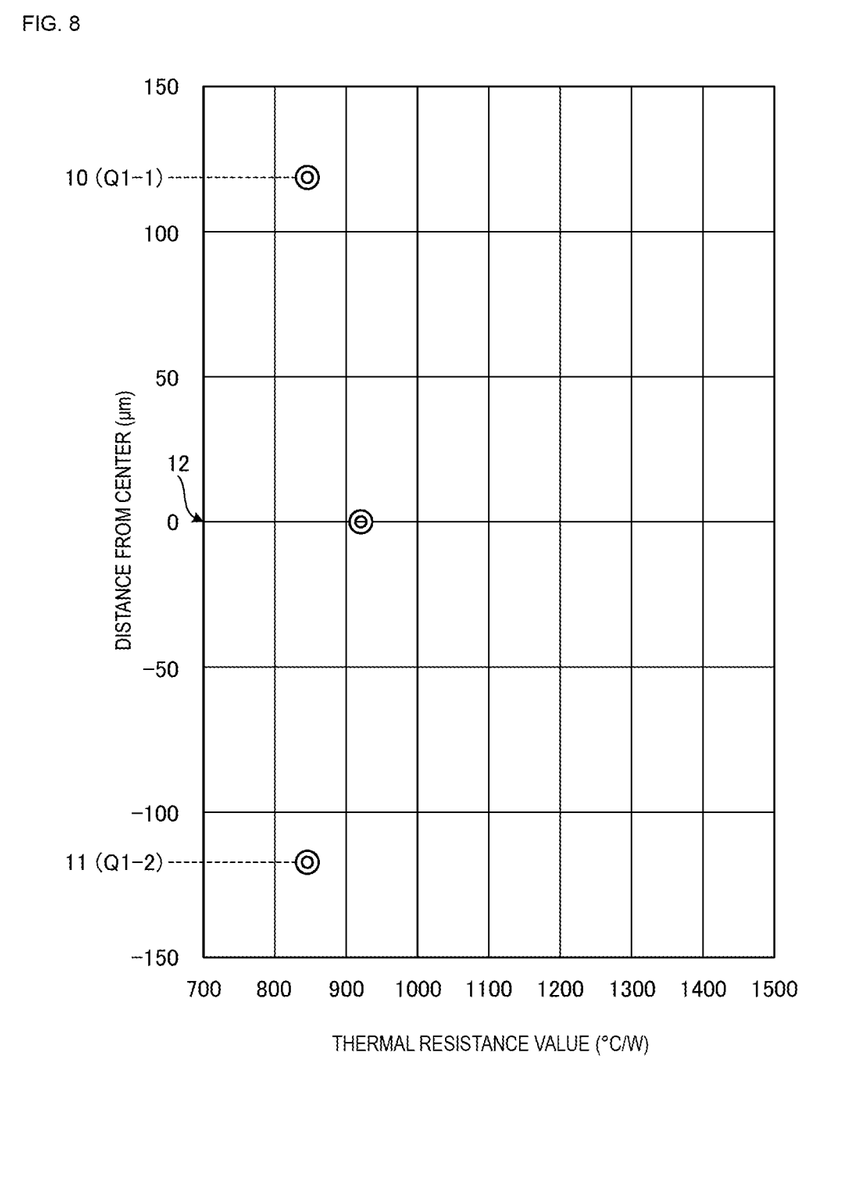
FIG. 8 is a graph illustrating a relationship between, in the power amplifier device according to the embodiment, a position in a second direction and a thermal resistance value.
Figure 9:
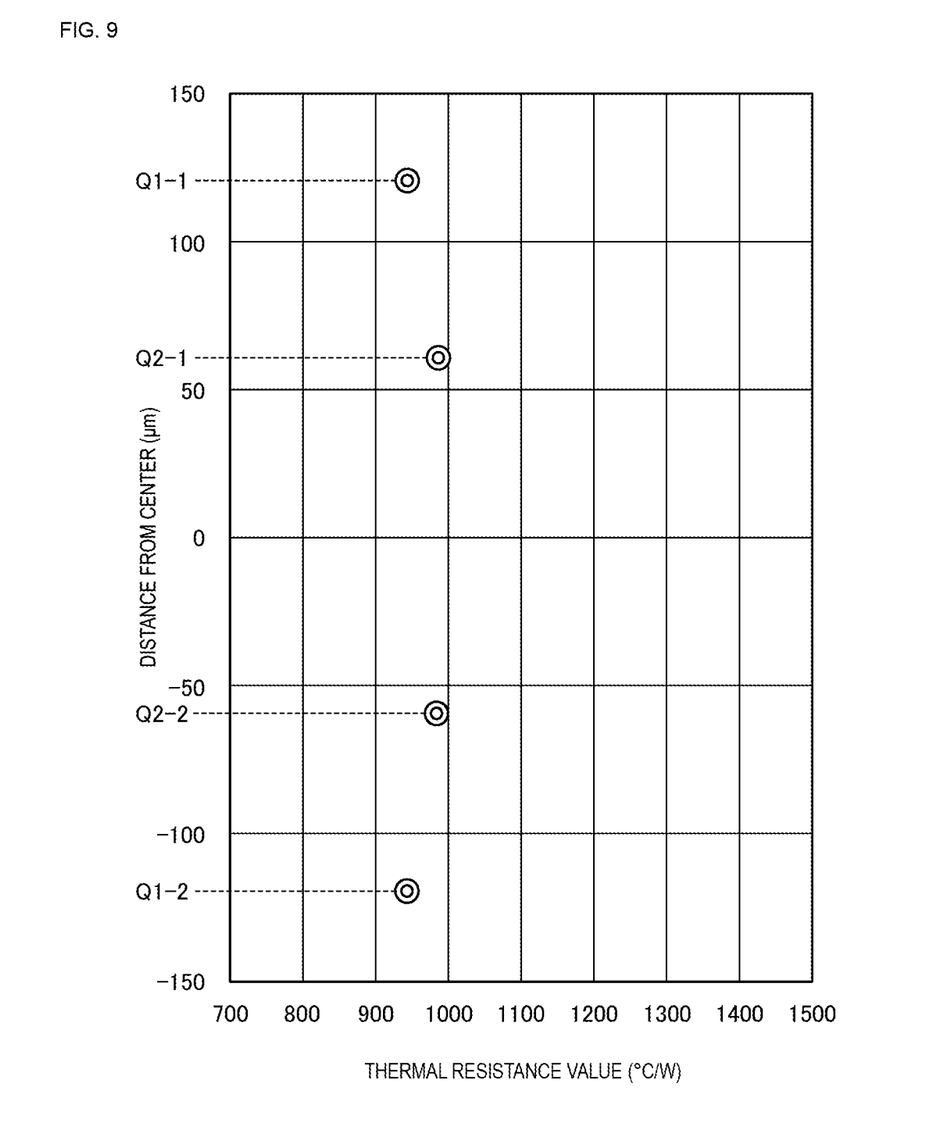
FIG. 9 is a graph illustrating a relationship between, in a power amplifier device according to a comparative example, a position in the second direction and a thermal resistance value.
Figure 10:
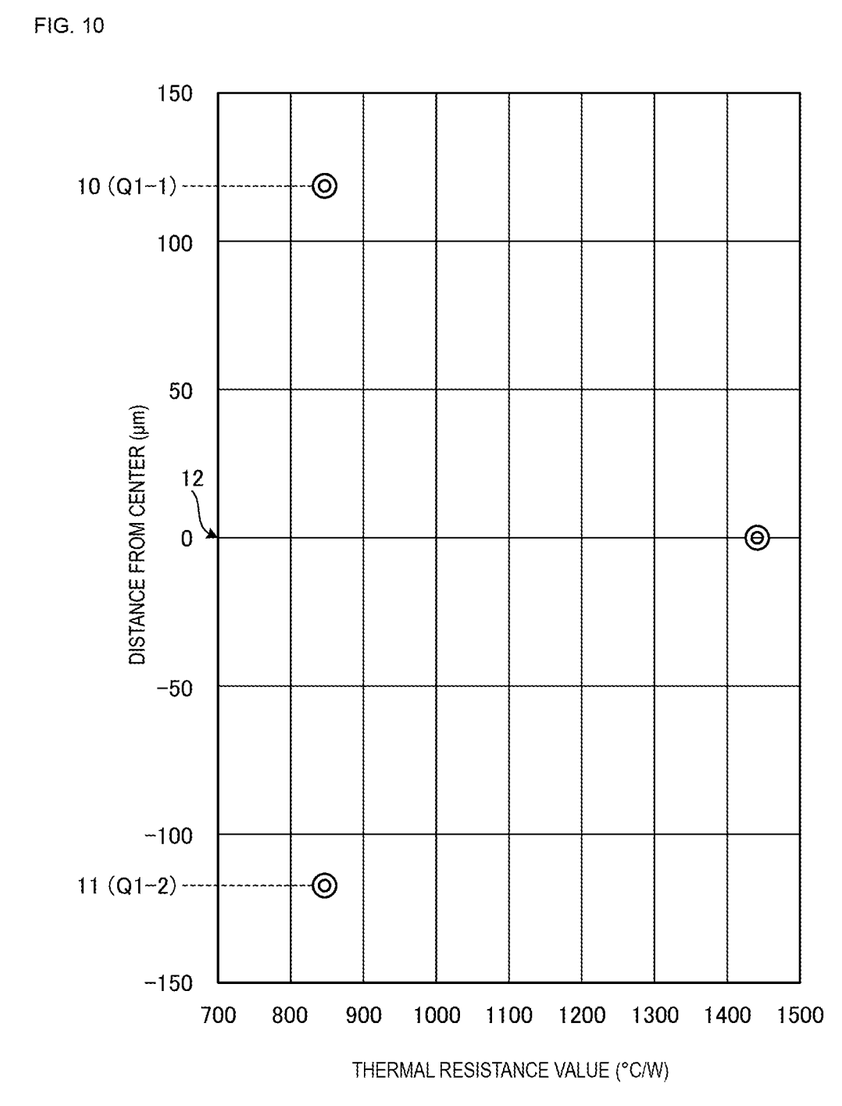
FIG. 10 is a graph illustrating a relationship between, in a power amplifier device according to a modification, a position in the second direction and a thermal resistance value.

FIG. 8 is a graph illustrating a relationship between, in the power amplifier device according to the embodiment, a position in the second direction and a thermal resistance value. FIG. 9 is a graph illustrating a relationship between, in a power amplifier device according to a comparative example, a position in the second direction and a thermal resistance value. In the comparative example, the same structure as that illustrated in FIG. 7 is employed, and a bump (substantially elliptical shape) integrally formed so as to cover all of the plurality of first transistors Q1-1 and Q1-2 and the plurality of second transistors Q2-1 and Q2-2 is provided. FIG. 10 is a graph illustrating a relationship between, in a power amplifier device according to a modification, a position in the second direction and a thermal resistance value. In the graphs of FIGS. 8 to 10, the vertical axis represents a position in the second direction Dy when a center position of the second bump 12 in FIG. 2 serves as an origin, and the horizontal axis represents a thermal resistance value.

In graph 3 illustrated in FIG. 8, the vertical axis represents, of the first bump 11 (first transistor Q1-2), the second bump 12, and the first bump 10 (first transistor Q1-1), the respective positions in the second direction Dy. The power amplifier device according to the comparative example illustrated in FIG. 9 is a power amplifier device in which a substantially elliptical bump is provided as in the above-described comparative example. In graph 4 illustrated in FIG. 9, the vertical axis represents, of the first transistor Q1-2, the second transistor Q2-2, the second transistor Q2-1, and the first transistor Q1-1, the respective positions in the second direction Dy.

The power amplifier device according to the modification illustrated in FIG. 10 differs from the power amplifier device 100 according to the embodiment in that no connection portions 15 are provided and the second bump 12 and the semiconductor substrate 1 are not electrically connected. The power amplifier device according to the modification is similar to the power amplifier device 100 according to the embodiment in terms of a layout relationship between and circuit configurations of the plurality of first transistors Q1-1 and Q1-2, the plurality of second transistors Q2-1 and Q2-2, the first bumps 10 and 11, and the second bump 12. In graph 5 illustrated in FIG. 10, as in FIG. 8, the vertical axis represents, of the first bump 11 (first transistor Q1-2), the second bump 12, and the first bump 10 (first transistor Q1-1), the respective positions in the second direction Dy.

As illustrated in FIG. 9, the power amplifier device according to the comparative example in which the substantially elliptical bump is provided exhibits low thermal resistance values in regions overlaid with the respective transistors along the second direction Dy. Furthermore, variations in thermal resistance values in the regions overlaid with the respective transistors are small.

In the power amplifier device according to the modification illustrated in FIG. 10, no connection portions 15 are provided in a region overlaid with the second bump 12, and no heat-transfer paths between the second bump 12 and the semiconductor substrate 1 are formed. For this reason, in a region that is near a central portion in the second direction Dy and is overlaid with the second bump 12, an increase in thermal resistance value is exhibited.

On the other hand, as illustrated in FIG. 8, the power amplifier device 100 according to the embodiment exhibits low thermal resistance values in regions overlaid with the first bump 11 (first transistor Q1-2), the second bump 12, and the first bump 10 (first transistor Q1-1) along the second direction Dy. Furthermore, in the power amplifier device 100 according to the embodiment, the connection portions 15 are provided, and the heat-transfer paths between the second bump 12 and the semiconductor substrate 1 are formed, and thus it is indicated that an increase in thermal resistance value can be suppressed even in a region overlaid with the second bump 12 in comparison with graph 5 of FIG. 10.

As described above, the power amplifier device 100 includes the semiconductor substrate 1, the plurality of first transistors Q1-1 and Q1-2, the plurality of second transistors Q2-1 and Q2-2, the plurality of first bumps 10 and 11, and the second bump 12. The plurality of first transistors Q1-1 and Q1-2 are provided on the semiconductor substrate 1 and receive input of a radio-frequency signal (radio-frequency input signal RFin). The plurality of second transistors Q2-1 and Q2-2 are provided on the semiconductor substrate 1 and electrically connected to the respective plurality of first transistors Q1-1 and Q1-2, and output a radio-frequency output signal RFout obtained by amplifying the radio-frequency signal. The plurality of first bumps 10 and 11 are provided so as to overlay the respective plurality of first transistors Q1-1 and Q1-2. The second bump 12 is provided away from the plurality of first bumps 10 and 11 and provided so as not to overlay the plurality of first transistors Q1-1 and Q1-2 and the plurality of second transistors Q2-1 and Q2-2. When viewed in plan from a direction perpendicular to the surface of the semiconductor substrate 1, the first transistor Q1-2 and the first bump 11, the second transistor Q2-2, the second bump 12, the second transistor Q2-1, and the first transistor Q1-1 and the first bump 10 are arranged in sequence.

Thus, the second transistors Q2-1 and Q2-2 are provided so as not to be overlaid with the first bumps 10 and 11 and the second bump 12. For this reason, in comparison with the case where one substantially elliptical bump is provided so as to overlay the plurality of first transistors Q1-1 and Q1-2 and the plurality of second transistors Q2-1 and Q2-2, the feedback capacitance of the second transistors Q2-1 and Q2-2 can be reduced. Consequently, the power amplifier device 100 achieves an improvement in circuit stability and enables an improvement in characteristics.

Furthermore, the first bumps 10 and 11 are provided so as to overlay the plurality of first transistors Q1-1 and Q1-2, and the second bump 12 is provided between the first bump 10 and the first bump 11. Thus, in comparison with a configuration in which a bump is provided only in a region not overlaid with each transistor, the power amplifier device 100 can achieve excellent heat dissipation.

Furthermore, the power amplifier device 100 includes at least one or more insulating films 31 provided between the semiconductor substrate 1 and the second bump 12, and a connection portion 15, in a region overlaid with the second bump 12, extending through the at least one or more insulating films 31 in a thickness direction and connected to the semiconductor substrate 1.

Thus, the connection portion 15 forms a heat-transfer path through which heat is transferred from a semiconductor substrate 1 side to the second bump 12. Consequently, the heat generated in the second transistors Q2-1 and Q2-2 not overlaid with the second bump 12 is transferred to the second bump 12 from the semiconductor substrate 1 through the connection portion 15 and can be successfully dissipated to the outside.

Furthermore, the power amplifier device 100 includes the plurality of connection portions 15, 16, and 17, and a plurality of capacitors (second capacitors C2-1 and C2-2) and a plurality of resistors (second resistors R2-1 and R2-2) connected to the respective bases of the plurality of second transistors Q2-1 and Q2-2. When viewed in plan, the plurality of second capacitors C2-1 and C2-2 and the plurality of second resistors R2-1 and R2-2 are disposed between the connection portion 15 and the connection portions 16 and 17 adjacent to the connection portion 15 in the first direction Dx and are provided between the plurality of second transistors Q2-1 and Q2-2 adjacent to each other in the second direction Dy intersecting the first direction Dx.

Thus, in the region overlaid with the second bump 12, the plurality of connection portions 15, 16, and 17, the plurality of capacitors, and the plurality of resistors can be efficiently disposed. Consequently, the power amplifier device 100 enables an improvement in heat dissipation while being reduced in size.

Furthermore, the power amplifier device 100 includes the plurality of first capacitors C1-1 and C1-2 and the plurality of first resistors R1-1 and R1-2 connected to the respective bases of the plurality of first transistors Q1-1 and Q1-2. At least one or more of the plurality of first capacitors C1-1 and C1-2 and the plurality of first resistors R1-1 and R1-2 are provided so as to be overlaid with the plurality of first bumps 10 and 11.

Thus, the heat generated in the plurality of first capacitors C1-1 and C1-2 and the plurality of first resistors R1-1 and R1-2 is also dissipated from the first bumps 10 and 11 to the outside efficiently.

Furthermore, the power amplifier device 100 includes the plurality of second capacitors C2-1 and C2-2 and the plurality of second resistors R2-1 and R2-2 connected to the respective bases of the plurality of second transistors Q2-1 and Q2-2. When viewed in plan, the plurality of second capacitors C2-1 and C2-2 and the plurality of second resistors R2-1 and R2-2 are provided between the plurality of second transistors Q2-1 and Q2-2 adjacent to each other. At least one or more of the plurality of second capacitors C2-1 and C2-2 and the plurality of second resistors R2-1 and R2-2 are provided so as to be overlaid with the second bump 12.

Thus, the heat generated in the plurality of second capacitors C2-1 and C2-2 and the plurality of second resistors R2-1 and R2-2 is also dissipated from the second bump 12 to the outside efficiently.

The above-described embodiment is intended to facilitate understanding of the present disclosure but is not intended for a limited interpretation of the present disclosure. The present disclosure can be changed or improved without departing from the gist thereof and also encompasses equivalents thereof.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier device comprising:
   a semiconductor substrate; a plurality of first transistors provided on the semiconductor substrate and configured to receive an input of a radio-frequency signal;
   a plurality of second transistors provided on the semiconductor substrate, electrically connected to the respective plurality of first transistors, and configured to output a radio-frequency output signal obtained by amplifying the radio-frequency signal;
   a plurality of first bumps provided so as to overlay the respective plurality of first transistors and a second bump provided away from the plurality of first bumps and provided so as not to overlay the plurality of first transistors and the plurality of second transistors,
   wherein, when viewed in plan from a direction perpendicular to a surface of the semiconductor substrate, one of the first transistors and one of the first bumps, one of the second transistors, the second bump, another one of the second transistors and another one of the first transistors and another one of the first bumps are arranged in a linear sequential order.

2. The power amplifier device according to claim 1, wherein the power amplifier device further comprises:
at least one or more insulating films provided between the semiconductor substrate and the second bump; and
at least one or more connection portions, in a region overlaid with the second bump, extending through the at least one or more insulating films in a thickness direction and connected to the semiconductor substrate.

3. The power amplifier device according to claim 2, wherein at least one or more connection portions comprise a plurality of connection portions, and
the power amplifier device further comprises:
a plurality of capacitors and a plurality of resistors connected to respective bases of the plurality of second transistors, and
wherein, when viewed in plan, the plurality of capacitors and the plurality of resistors are disposed between adjacent ones of the plurality of connection portions in a first direction and are provided between adjacent ones of the plurality of second transistors in a second direction intersecting the first direction.

4. The power amplifier device according to claim 1, wherein the power amplifier device further comprises
a plurality of first capacitors and a plurality of first resistors connected to respective bases of the plurality of first transistors, and
wherein at least one or more of the plurality of first capacitors and the plurality of first resistors are provided so as to be overlaid with the plurality of first bumps.

5. The power amplifier device according to claim 4, wherein the power amplifier device further comprises
a plurality of second capacitors and a plurality of second resistors connected to respective bases of the plurality of second transistors,
wherein, when viewed in plan, the plurality of second capacitors and the plurality of second resistors are provided between adjacent ones of the plurality of second transistors, and
wherein at least one or more of the plurality of second capacitors and the plurality of second resistors are provided so as to be overlaid with the second bump.

6. The power amplifier device according to claim 1, wherein one of the first transistors and one of the first bumps, one of the second transistors, the second bump, another one of the second transistors, and another one of the first transistors and another one of the first bumps are disposed on a straight line.

7. The power amplifier device according to claim 2, wherein one of the first transistors and one of the first bumps, one of the second transistors, the second bump, another one of the second transistors, and another one of the first transistors and another one of the first bumps are disposed on a straight line.

8. The power amplifier device according to claim 3, wherein one of the first transistors and one of the first bumps, one of the second transistors, the second bump, another one of the second transistors, and another one of the first transistors and another one of the first bumps are disposed on a straight line.

9. The power amplifier device according to claim 4, wherein one of the first transistors and one of the first bumps, one of the second transistors, the second bump, another one of the second transistors, and another one of the first transistors and another one of the first bumps are disposed on a straight line.

* * * * *